US012667906B2

(12) United States Patent
Brunner et al.

(10) Patent No.: US 12,667,906 B2
(45) Date of Patent: Jun. 30, 2026

(54) METHODS OF CALIBRATING AN ULTRASONIC CHARACTERISTIC ON A WIRE BONDING SYSTEM

(71) Applicant: KULICKE AND SOFFA INDUSTRIES, INC., Fort Washington, PA (US)

(72) Inventors: Jon W. Brunner, Sellersville, PA (US); Wei Qin, Ambler, PA (US); Aashish Shah, Chalfont, PA (US); Hui Xu, Chalfont, PA (US); Jeong Ho Yang, Blue Bell, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 18/802,075

(22) Filed: Aug. 13, 2024

(65) Prior Publication Data

US 2024/0404986 A1 Dec. 5, 2024

Related U.S. Application Data

(63) Continuation of application No. 17/987,708, filed on Nov. 15, 2022, now Pat. No. 12,113,043.

(Continued)

(51) Int. Cl.
B23K 20/00 (2006.01)
B23K 20/10 (2006.01)
(Continued)

(52) U.S. Cl.
CPC .......... B23K 20/10 (2013.01); B23K 2101/40 (2018.08); H10W 72/07113 (2026.01); H10W 72/07141 (2026.01); H10W 72/07183 (2026.01)

(58) Field of Classification Search
CPC .... B23K 20/10; B23K 31/125; B23K 20/005; B23K 20/007; B23K 20/004; B23K 20/106
See application file for complete search history.

(56) References Cited

U.S. PATENT DOCUMENTS 9,153,554 B2 10/2015 Kulicke
2003/0167846 A1 9/2003 Farassat
(Continued)

FOREIGN PATENT DOCUMENTS

CN 103531494 1/2014
WO WO2009002345 A1 12/2008

OTHER PUBLICATIONS

International Search Report for International Patent Application No. PCT/US2022/049991, completed on Mar. 20, 2023.

*Primary Examiner* — Erin B Saad
(74) *Attorney, Agent, or Firm* — Christopher M. Spletzer, Sr.

(57) ABSTRACT

A method of calibrating an ultrasonic characteristic on a wire bonding system is provided. The method includes the steps of: (a) determining a reference ultrasonic characteristic for formation of a wire bond; (b) determining a reference non-stick ultrasonic characteristic that results in a non-stick wire bond condition; (c) determining a calibration non-stick ultrasonic characteristic, on a wire bonding system to be calibrated, that results in a non-stick wire bond condition; and (d) determining a calibration factor for the wire bonding system to be calibrated using the reference non-stick ultrasonic characteristic and the calibration non-stick ultrasonic characteristic.

24 Claims, 14 Drawing Sheets

Related U.S. Application Data

(60)  Provisional application No. 63/280,107, filed on Nov. 16, 2021.

(51)  Int. Cl.
*B23K 101/40*      (2006.01)
*H10W 72/00*      (2026.01)

(56)              References Cited

U.S. PATENT DOCUMENTS

| | | | | |
|---|---|---|---|---|
| 2008/0011809 A1* | 1/2008 | Seyama | B23K 20/10 | 228/1.1 |
| 2010/0051670 A1* | 3/2010 | Okafuji | H01L 24/85 | 228/1.1 |
| 2011/0062216 A1* | 3/2011 | Sano | B23K 20/007 | 228/1.1 |
| 2013/0253325 A1* | 9/2013 | Call | A61B 8/54 | 600/447 |
| 2013/0277414 A1* | 10/2013 | Brunner | H01L 24/45 | 228/102 |
| 2014/0209663 A1* | 7/2014 | Song | H01L 24/78 | 228/1.1 |
| 2015/0246411 A1* | 9/2015 | Sekine | H01L 24/78 | 228/9 |
| 2015/0249063 A1* | 9/2015 | Sekine | B23K 20/005 | 228/4.5 |
| 2021/0272927 A1 | 9/2021 | Aoyagi et al. | | |
| 2021/0362268 A1* | 11/2021 | Ayabakan | B29C 66/9516 | |

* cited by examiner

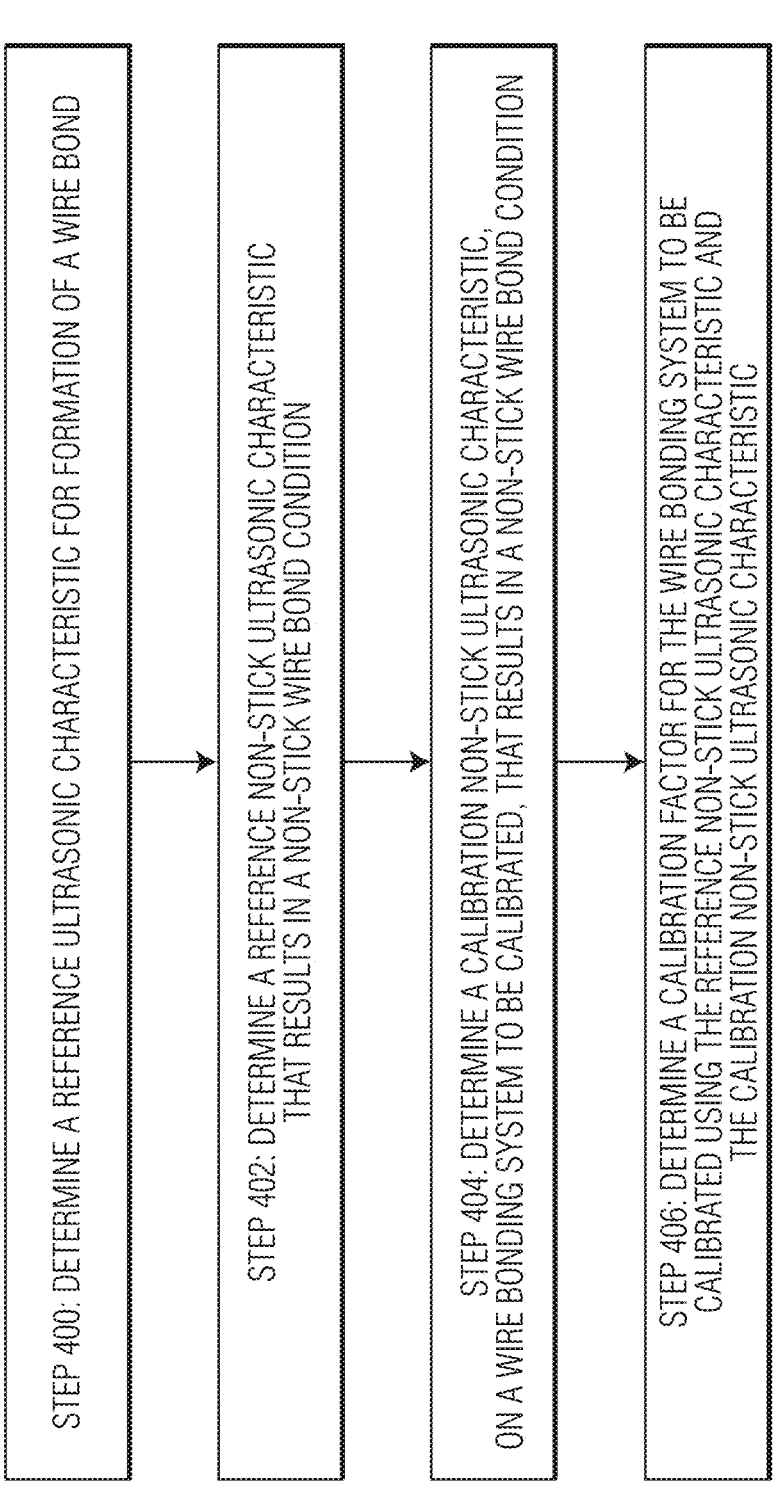

STEP 400: DETERMINE A REFERENCE ULTRASONIC CHARACTERISTIC FOR FORMATION OF A WIRE BOND

STEP 402: DETERMINE A REFERENCE NON-STICK ULTRASONIC CHARACTERISTIC THAT RESULTS IN A NON-STICK WIRE BOND CONDITION

STEP 404: DETERMINE A CALIBRATION NON-STICK ULTRASONIC CHARACTERISTIC, ON A WIRE BONDING SYSTEM TO BE CALIBRATED, THAT RESULTS IN A NON-STICK WIRE BOND CONDITION

STEP 406: DETERMINE A CALIBRATION FACTOR FOR THE WIRE BONDING SYSTEM TO BE CALIBRATED USING THE REFERENCE NON-STICK ULTRASONIC CHARACTERISTIC AND THE CALIBRATION NON-STICK ULTRASONIC CHARACTERISTIC

FIG. 4

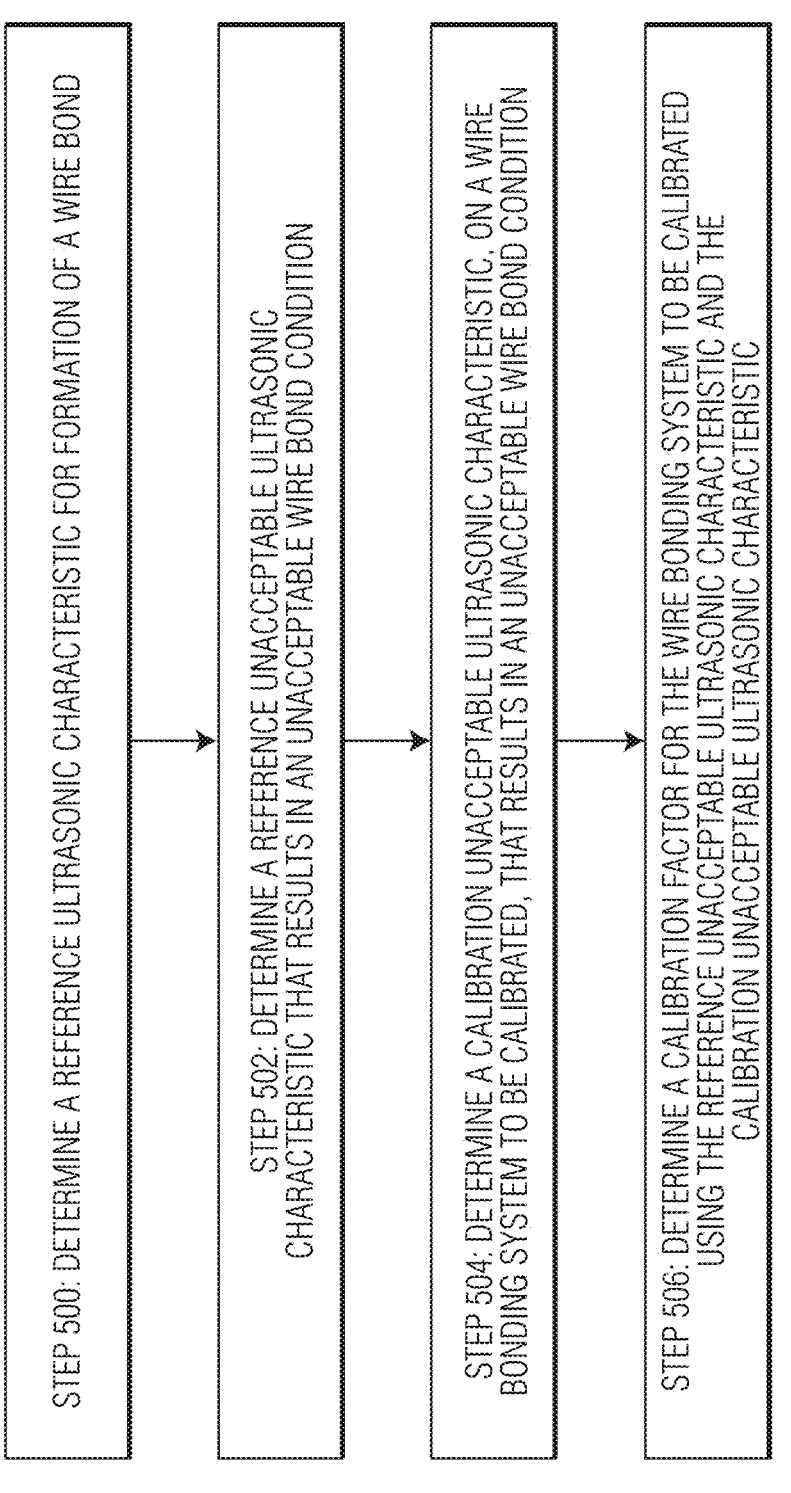

STEP 500: DETERMINE A REFERENCE ULTRASONIC CHARACTERISTIC FOR FORMATION OF A WIRE BOND

STEP 502: DETERMINE A REFERENCE UNACCEPTABLE ULTRASONIC CHARACTERISTIC THAT RESULTS IN AN UNACCEPTABLE WIRE BOND CONDITION

STEP 504: DETERMINE A CALIBRATION UNACCEPTABLE ULTRASONIC CHARACTERISTIC, ON A WIRE BONDING SYSTEM TO BE CALIBRATED, THAT RESULTS IN AN UNACCEPTABLE WIRE BOND CONDITION

STEP 506: DETERMINE A CALIBRATION FACTOR FOR THE WIRE BONDING SYSTEM TO BE CALIBRATED USING THE REFERENCE UNACCEPTABLE ULTRASONIC CHARACTERISTIC AND THE CALIBRATION UNACCEPTABLE ULTRASONIC CHARACTERISTIC

FIG. 5

METHODS OF CALIBRATING AN ULTRASONIC CHARACTERISTIC ON A WIRE BONDING SYSTEM

CROSS-REFERENCE TO RELATED APPLICATION

This application is a continuation application of U.S. patent application Ser. No. 17/987,708, filed on Nov. 15, 2022, which claims the benefit of U.S. Provisional Application No. 63/280,107, filed on Nov. 16, 2021, the content of both of which is incorporated herein by reference.

FIELD

The invention relates to wire bonding operations, and in particular, to methods of calibrating ultrasonic characteristics on a wire bonding system.

BACKGROUND

In connection with semiconductor assembly, wire bonding continues to be a widely used process for providing electrical interconnections within a semiconductor package. Various process parameters are utilized in connection with a wire bonding process. For example, ultrasonic energy (and associated process parameters) is often used to bond a wire to a workpiece.

Often, wire bonding processes may not be repeatable using the same parameters. For example, one wire bonding system may be different from another wire bonding system. Thus, using the same process parameters (e.g., wire bonding parameters) on one wire bonding system may not result in the same performance (e.g., the same quality of wire bonds) on another wire bonding system.

Further, using the same process parameters (e.g., wire bonding parameters) on the same wire bonding system may not result in the same performance. For example, when changes occur on a wire bonding system (e.g., new wire bonding tool, new spool of wire, changes due to the age or condition of the system, etc.), the performance (e.g., the quality of wire bonds) may change using the same parameters.

Thus, it would be desirable to provide improved methods of calibrating an ultrasonic characteristics on a wire bonding system.

SUMMARY

According to an exemplary embodiment of the invention, a method of calibrating an ultrasonic characteristic on a wire bonding system is provided. The method includes the steps of: (a) determining a reference ultrasonic characteristic for formation of a wire bond; (b) determining a reference non-stick ultrasonic characteristic that results in a non-stick wire bond condition; (c) determining a calibration non-stick ultrasonic characteristic, on a wire bonding system to be calibrated, that results in a non-stick wire bond condition; and (d) determining a calibration factor for the wire bonding system to be calibrated using the reference non-stick ultrasonic characteristic and the calibration non-stick ultrasonic characteristic.

According to an exemplary embodiment of the invention, a method of calibrating an ultrasonic characteristic on a wire bonding system is provided. The method includes the steps of: (a) determining a reference ultrasonic characteristic for formation of a wire bond; (b) determining a reference unacceptable ultrasonic characteristic that results in an unacceptable wire bond condition; (c) determining a calibration unacceptable ultrasonic characteristic, on a wire bonding system to be calibrated, that results in an unacceptable wire bond condition; and (d) determining a calibration factor for the wire bonding system to be calibrated using the reference unacceptable ultrasonic characteristic and the calibration unacceptable ultrasonic characteristic.

The methods of the present invention may also be embodied as an apparatus (e.g., as part of the intelligence of a wire bonding system), or as computer program instructions on a computer readable carrier (e.g., a computer readable carrier including a wire bonding program used in connection with a wire bonding system).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 4-5 are flow diagrams illustrating methods of calibrating ultrasonic characteristics on a wire bonding system in accordance with yet another exemplary embodiment of the invention.

DETAILED DESCRIPTION

Figure 1A:
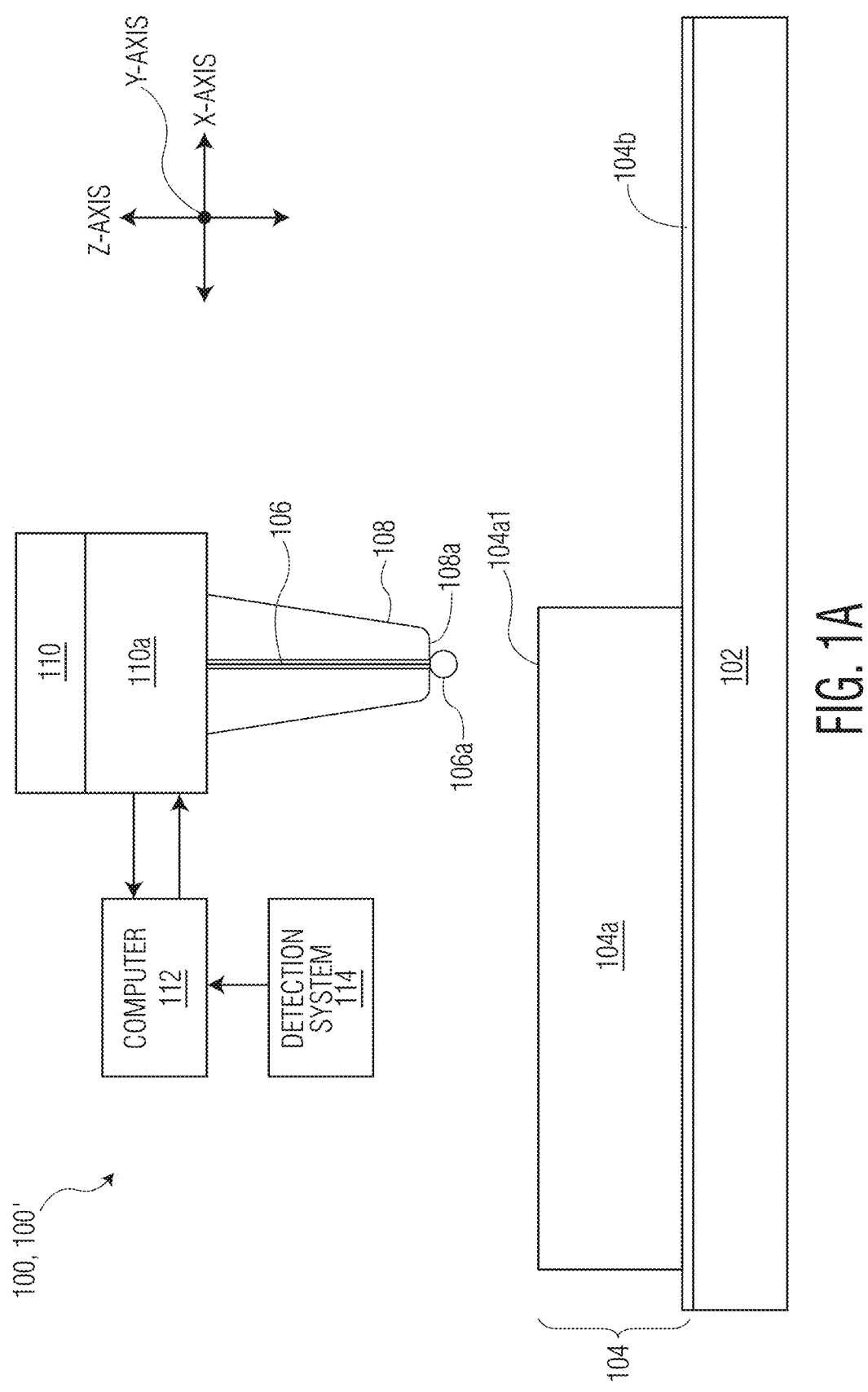
FIGS. 1A-1D are a series of block diagram views illustrating testing of a wire bond at a reference ultrasonic characteristic in accordance with an exemplary embodiment of the invention.

As used herein, the term "ultrasonic characteristic" is intended to refer to any variable (e.g., a value of a variable, a percentage of a variable, etc.) intended to adjust ultrasonic output of an ultrasonic transducer on a wire bonding system (e.g., a wire bonding machine). For example, such characteristics may be electrical characteristics (e.g., current, voltage, power, etc.). In a specific example, an ultrasonic characteristic is an electrical current value (or electrical current percentage) configured to be applied to an ultrasonic transducer on a wire bonding system to form the wire bond.

As will be appreciated by those skilled in the art, certain ultrasonic characteristics (e.g., electrical current, electrical power, etc.) as used on a wire bonding system may be expressed as a value (e.g., a certain value of milliamperes or mA), as a percentage (e.g., a percentage of a value, such as a percentage of a reference value), etc. Other ways of expressing such ultrasonic characteristics are contemplated.

Exemplary aspects of the invention relate to calibration methods for adjusting an ultrasonic characteristic on a wire bonding system, thereby providing portability of wire bonding systems (e.g., wire bonding machines). That is, features on the wire bonding systems provide for "on bonder" calibrations (e.g., real-time adjustments to one or more bonding parameters, such as ultrasonic characteristics) to overcome challenges related to machine portability (e.g., one machine being different from another machine, conditions changing on a given machine in production, etc.).

According to aspects of the invention, reference response data is collected at multiple ultrasonic characteristics (e.g., multiple values and/or percentages of electrical current applied to an ultrasonic transducer) to generate a reference ultrasonic characteristic for formation of a wire bond (e.g., an electrical current level applied to the ultrasonic transducer that forms a desirable ball bond of a wire loop). This reference response data may be collected, for example, from one or more wire bonding systems, or from a single reference wire bonding system. Using the reference response data (e.g., stored in memory), the reference ultrasonic characteristic is generated. This reference ultrasonic characteristic is stored (e.g., on a computer included on a wire bonding system, on a computer external from but accessible by a wire bonding system, etc.) as a "golden" value (e.g., a setpoint value for the ultrasonic characteristic, such as an electrical current setpoint configured to be applied to an ultrasonic transducer on a wire bonding system to form the wire bond). In a specific example, the reference ultrasonic characteristic may be stored in a bond program for a specific application. After the reference ultrasonic characteristic is determined, a reference unacceptable ultrasonic characteristic and a calibration unacceptable ultrasonic characteristic may be determined.

For example, a reference unacceptable ultrasonic characteristic is determined, where the reference unacceptable ultrasonic characteristic results in an unacceptable wire bond condition (e.g., a non-stick wire bond condition, a low shear strength wire bond condition, a low pull strength wire bond condition, and an unacceptable level of wire bond deformation). For example, in order to determine such a reference unacceptable ultrasonic characteristic, an applied ultrasonic characteristic (e.g., starting with the reference ultrasonic characteristic or some other value) in wire bonding operations may be incrementally adjusted (e.g., reduced, increased, both reduced and increased, etc.) until the unacceptable wire bond condition results, and then the reference unacceptable ultrasonic characteristic is determined when the unacceptable condition results. For example, the incremental adjustments may be values and/or percentages of the ultrasonic characteristic (e.g., ultrasonic current levels). The reference unacceptable ultrasonic characteristic may be stored in the computer with the reference ultrasonic characteristic (e.g., as part of a bond program for a specific application, in a local computer of the wire bonding system, in a remote computer accessible by the wire bonding system, etc.).

For example, then the calibration proceeds to determine a setpoint for a wire bonding system to be calibrated (e.g., a value of the ultrasonic characteristic for use on another wire bonding system). First, a calibration unacceptable ultrasonic characteristic is determined on the wire bonding system to be calibrated. The calibration unacceptable ultrasonic characteristic results in an unacceptable wire bond condition. To determine the calibration unacceptable ultrasonic characteristic, an ultrasonic characteristic (e.g., starting with the reference ultrasonic characteristic or some other value) is incrementally adjusted for additional wire bonds until an unacceptable bonding condition occurs (e.g., increased by 5%, decreased by 5%, increased by 1 unit, etc.). When the unacceptable bonding condition occurs, the corresponding ultrasonic characteristic may be considered the calibration unacceptable ultrasonic characteristic. Second, a calibration factor for the wire bonding system to be calibrated is determined using the reference unacceptable ultrasonic characteristic and the calibration unacceptable ultrasonic characteristic. The calibration factor may be determined by determining a difference between the reference unacceptable ultrasonic characteristic and the calibration unacceptable ultrasonic characteristic.

Then, a new setpoint may be calculated for the wire bonding system to be calibrated using the calibration factor. For example, the calibration factor may be applied to the reference ultrasonic characteristic (e.g., as a multiplier).

This setpoint may be considered the actual ultrasonic characteristic to be applied on the wire bonding system to be calibrated. However, the process of calibrating the ultrasonic characteristic on the wire bonding system to be calibrated may be repeated for a new wire bonding application and/or following a specific trigger. That is, the calibration may be done on a wire bonding system upon the occurrence of a trigger. Example triggers include: start-up of a wire bonding system (e.g., when a process program is first loaded on a machine); change of a wire spool on a wire bonding system; change of a wire bonding tool on a wire bonding system; at the request of an operator; upon the expiration of a predetermined time period; upon the expiration of a predetermined number of wire bonds on the wire bonding system; etc.

When a given trigger occurs, the calibration is performed to determine the setpoint for that wire bonding system and/or for a specific application on that wire bonding system.

An example is now described. Let us assume that a user has a specific wire bonding application. This application has specific requirements. For example, a specific wire, a specific wire bonding tool, a specific workpiece, a specific wire bonding program, a specific set of wire bonding parameters, etc. Using such application specific requirements, a desirable ultrasonic characteristic is determined (e.g., an electrical current value applied to a transducer, an electrical voltage value applied to a transducer, an electrical power value applied to a transducer, etc.). Let us assume that the desirable ultrasonic characteristic (e.g., a reference ultrasonic characteristic, UCREF) is 100 mA of electrical current.

Each of FIGS. 1A-1D, 2A-2D, and 3A-3D represent a series of tests where an applied ultrasonic characteristic is incrementally adjusted (e.g., reduced) until an unacceptable wire bond condition results. The applied ultrasonic characteristic may be an increment of the reference ultrasonic characteristic. In our example, the reference ultrasonic characteristic is 100 mA of electrical current. At FIGS. 1A-1D, the reference ultrasonic characteristic may be applied to achieve a desirable wire bond. At FIGS. 2A-2D, an increment of the reference ultrasonic characteristic has been applied, also resulting in an acceptable wire bond. At FIGS. 3A-3D, another increment of the reference ultrasonic characteristic has been applied, resulting in an unacceptable wire bond (e.g., a non-stick wire bond condition). Of course, this is a simple example, with only 3 tests points (i.e., FIGS. 1A-1D, FIGS. 2A-2D, and FIGS. 3A-3D); however, many more test points (at many different increments of the reference ultrasonic characteristic) may be utilized.

The process of incrementally adjusting an applied ultrasonic characteristic (as shown in FIGS. 1A-1D, FIGS. 2A-2D, and FIGS. 3A-3D) may be used to determine (i) a reference non-stick ultrasonic characteristic, and/or (ii) a calibration unacceptable ultrasonic characteristic. The reference non-stick ultrasonic characteristic may be determined on a reference wire bonding system (or a plurality of wire bonding systems). Such a reference wire bonding system is represented on FIGS. 1A-1D, FIGS. 2A-2D, and FIGS. 3A-3D as reference wire bonding system 100. The calibration unacceptable ultrasonic characteristic is determined on a wire bonding system to be calibrated (sometimes referred to herein as an "actual", "given" or "subject" wire bonding system). Such a wire bonding system to be calibrated is represented on FIGS. 1A-1D, FIGS. 2A-2D, and FIGS. 3A-3D as reference wire bonding system 100'.

FIGS. 1A-1D show bonding of a free air ball using the reference ultrasonic characteristic (e.g., setpoint of 100 mA). FIG. 1A illustrates reference wire bonding system 100, which includes a support structure 102 and a bond head assembly 110. Support structure 102 supports a workpiece 104, which includes a die 104a that is attached to a substrate 104b. Die 104a includes a first bond location 104a1. Bond head assembly 110 includes a transducer 110a that, in turn, carries a wire bonding tool 108. Wire bonding tool 108 includes a working end 108a. A wire 106 is threaded through wire bonding tool 108, and includes free air ball 106a at working end 108a. Transducer 110a is electrically connected to a computer 112 that is configured to store data and control the motion (and operation) of transducer 110a.

Computer 112 is electrically connected to detection system 114, which can detect whether bonded portions of wire are properly attached to their respective bonding locations (e.g., bond pads, leads, contacts, traces, etc.). For example, wire bonding machines marketed by Kulicke and Soffa Industries, Inc. often utilize a "BITS" process (i.e., Bond Integrity Test System) in connection with such a detection system to confirm that proper wire bonds have been formed. Exemplary details of such processes are disclosed in International Patent Application Publication WO 2009/002345, which is incorporated by reference herein in its entirety. Detection system 114 may detect if a bonded portion of a wire is properly attached to a bonding location via an electric continuity check. However, it is understood that other types of detection systems may be utilized (e.g., optical inspection systems for detection if a portion of wire is properly attached to a bonding location).

Figure 1B:
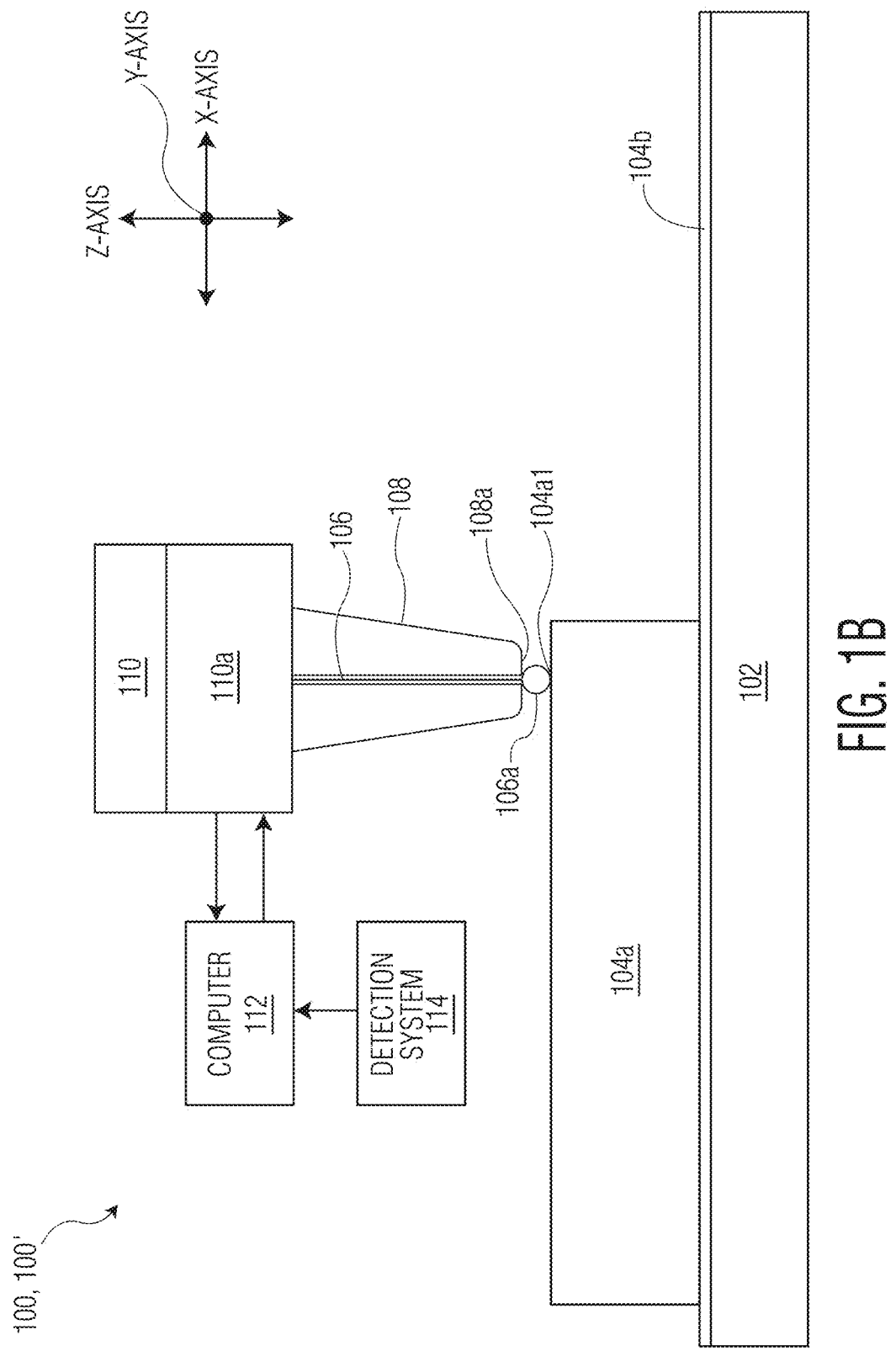
Figure 1C:
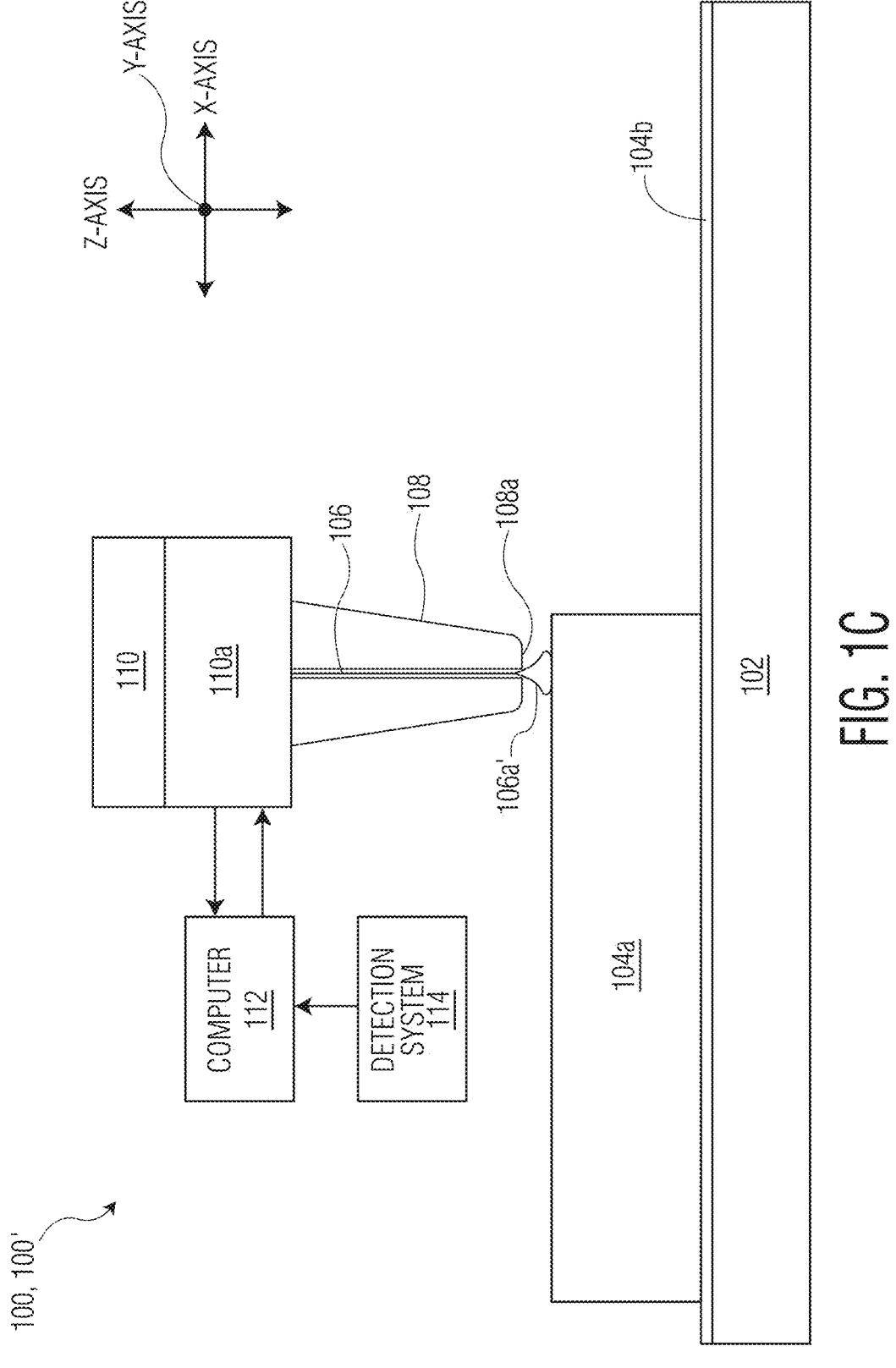
Figure 1D:
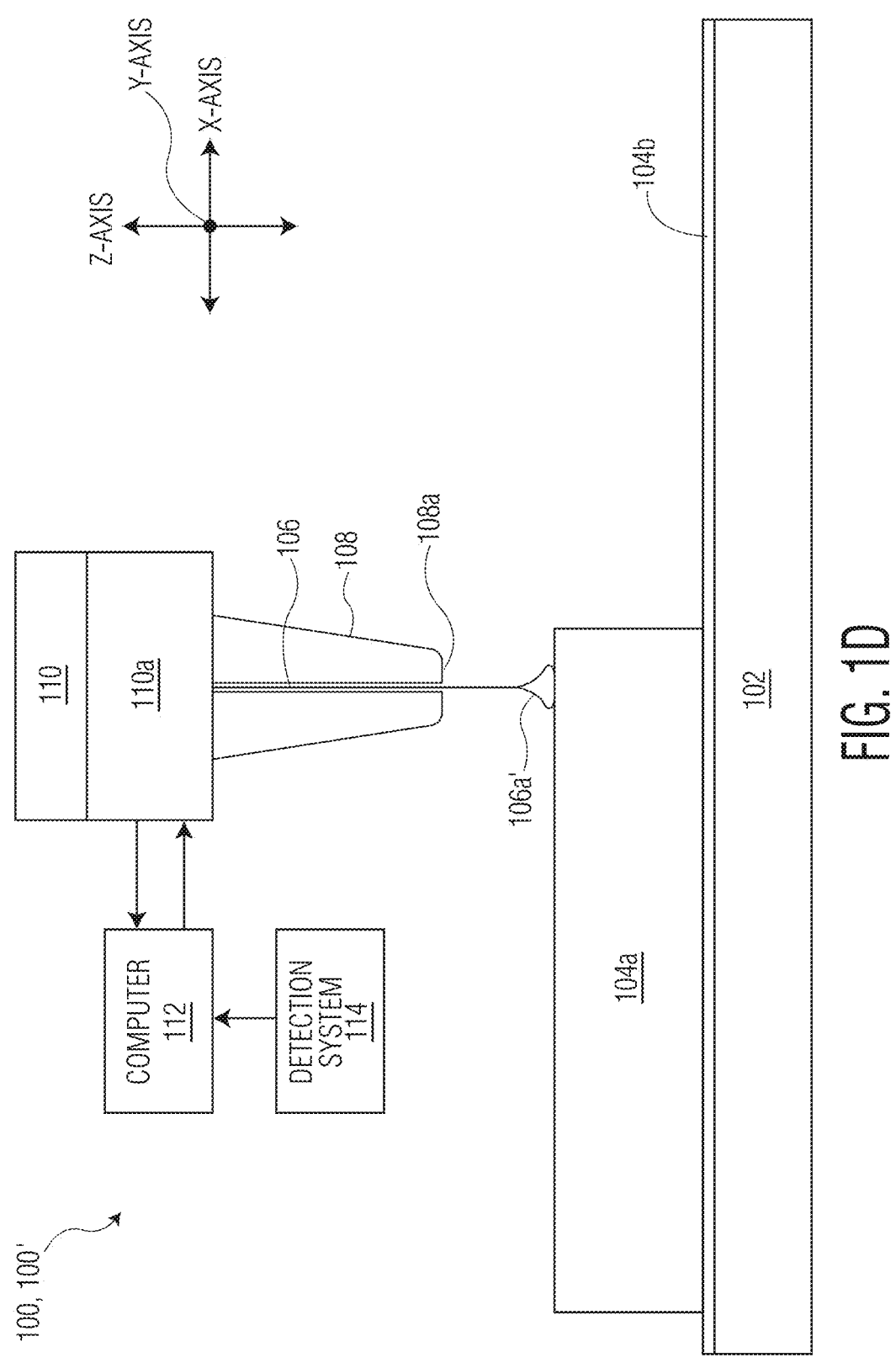
Figure 2A:
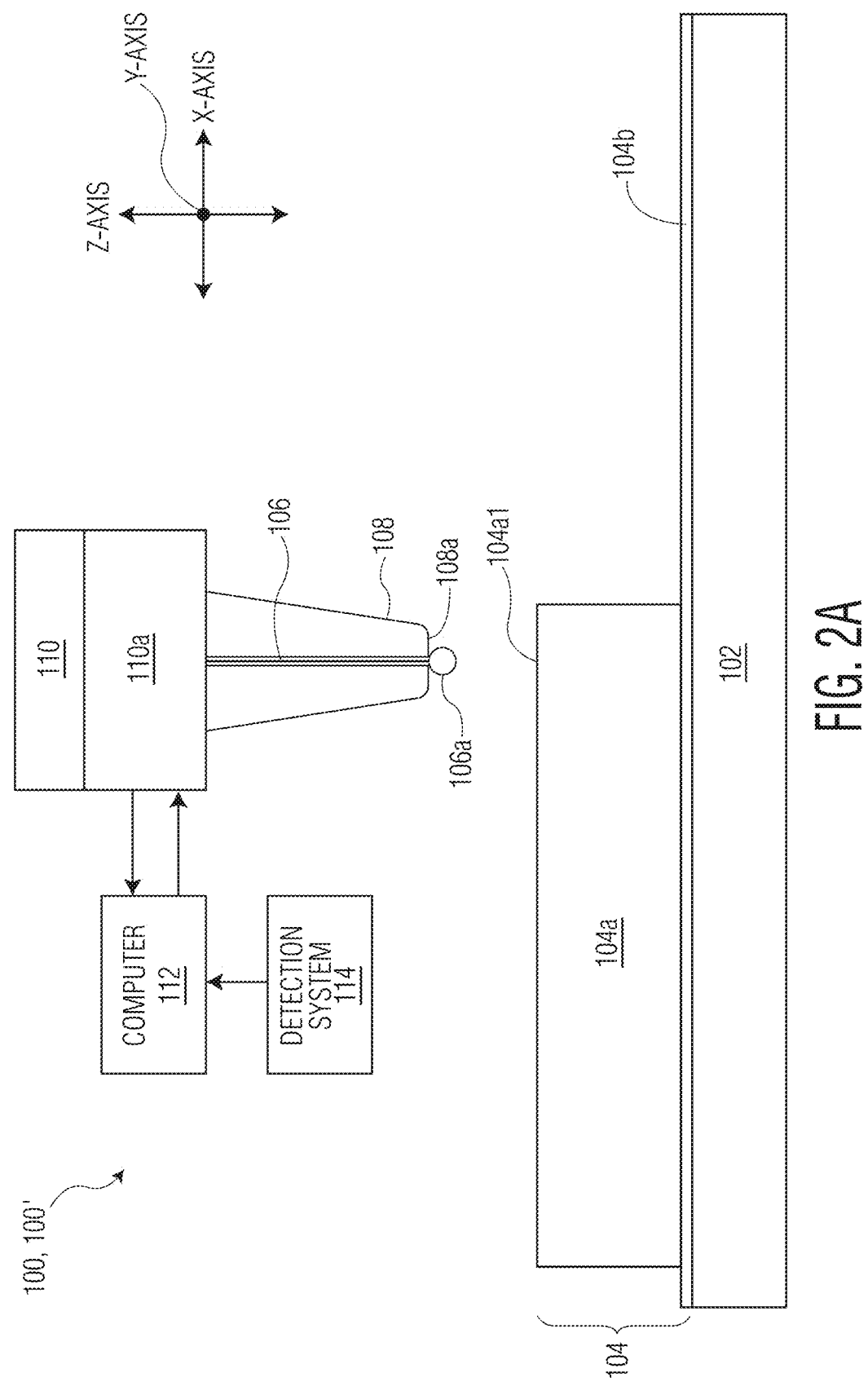
FIGS. 2A-2D are a series of block diagram views illustrating testing of a wire bond at a modified ultrasonic characteristic in accordance with an exemplary embodiment of the invention.
Figure 2B:
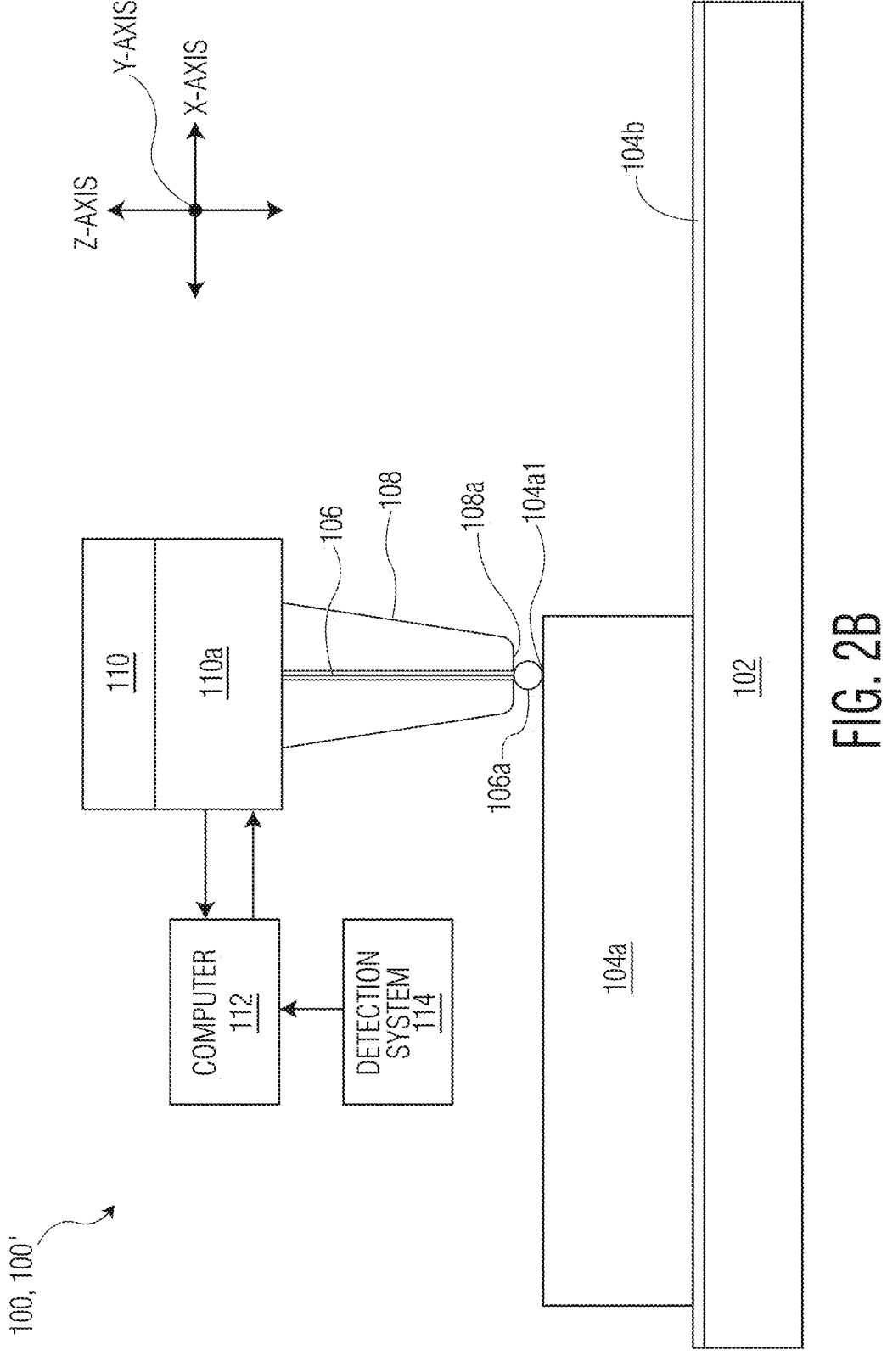
Figure 2C:
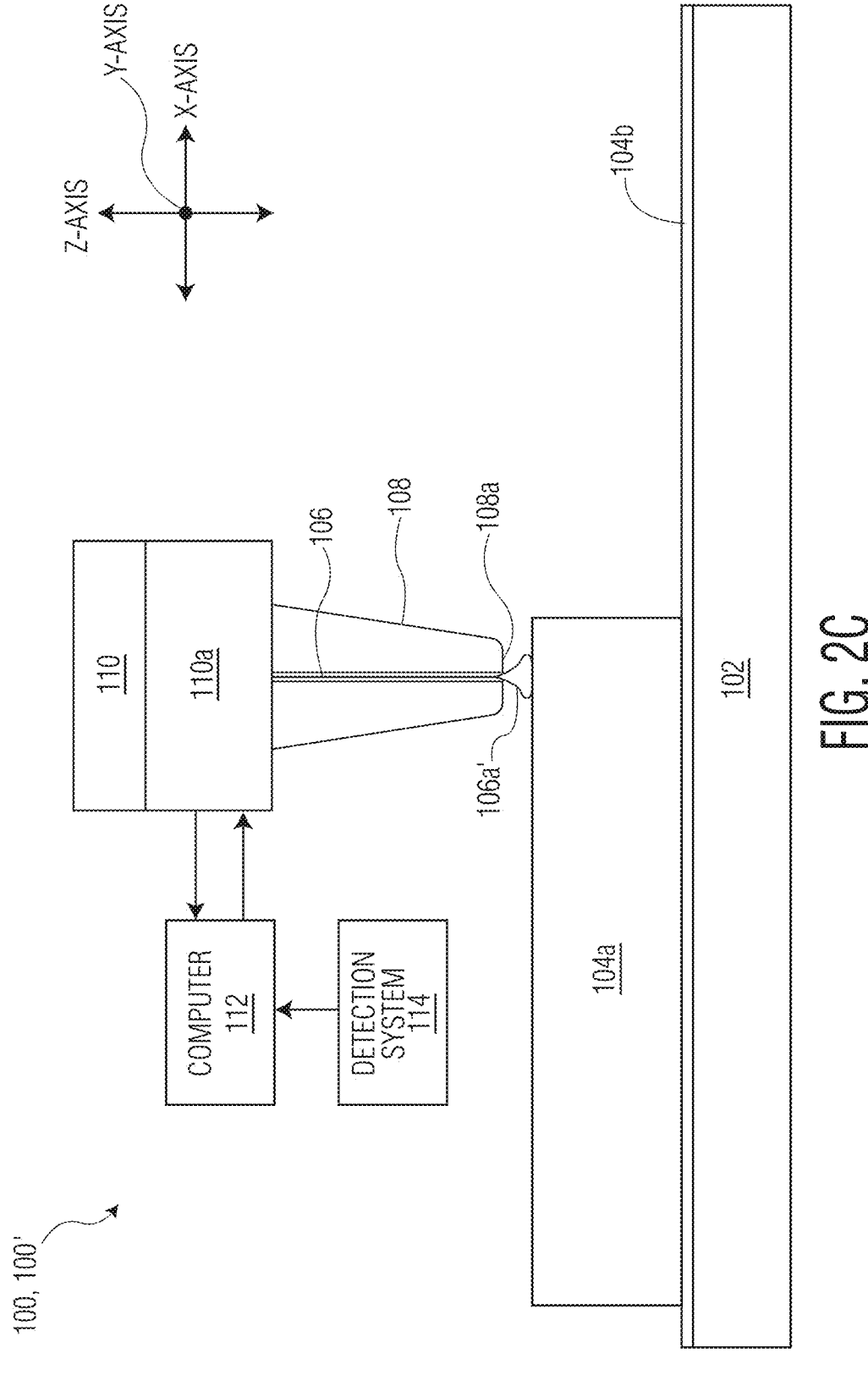
Figure 2D:
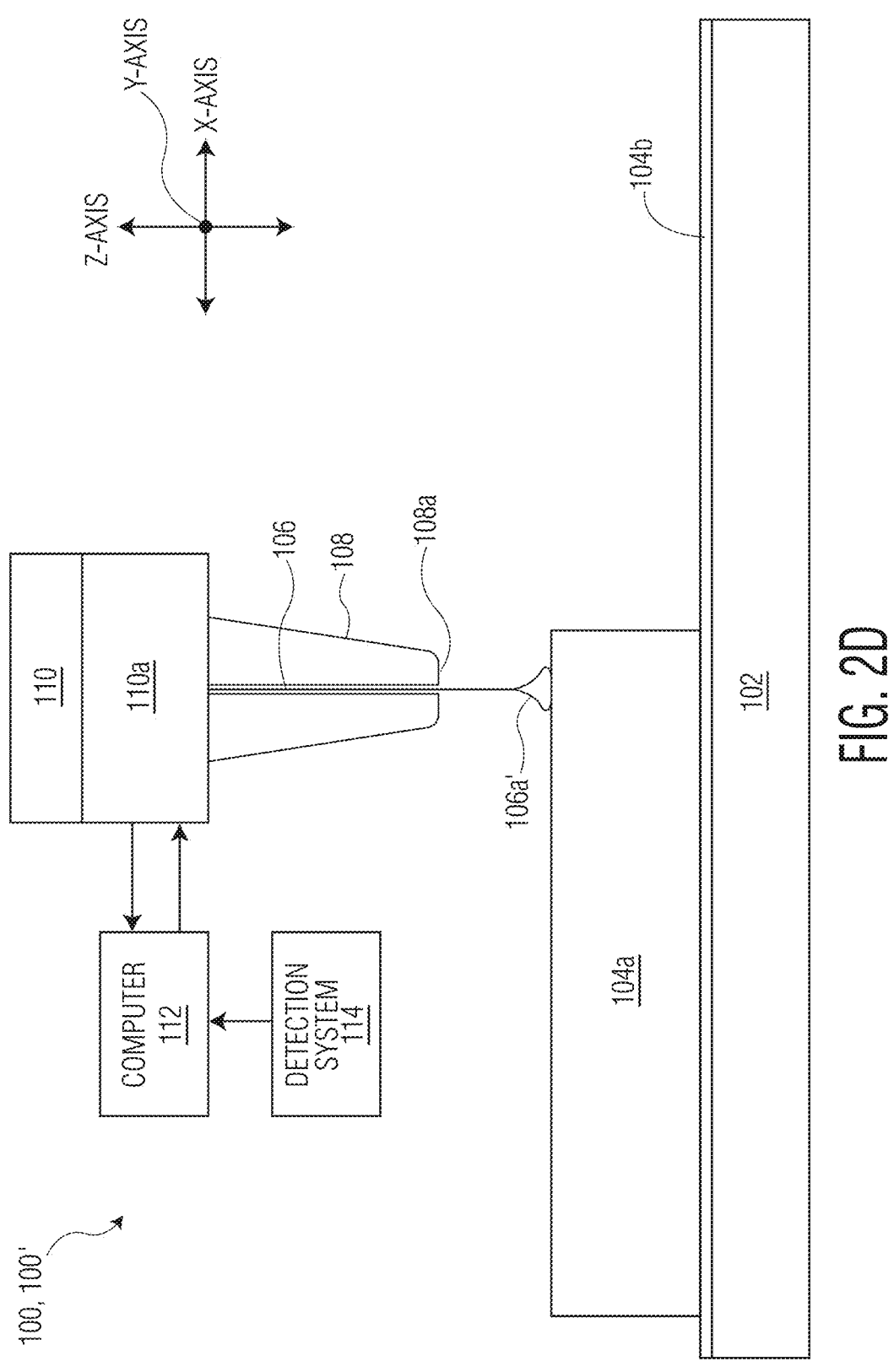

FIG. 1B illustrates the beginning of the bonding process on wire bonding system 100. In FIG. 1B, bond head assembly 110 has moved downward until free air ball 106a has made contact with first bond location 104a1 of die 104a. In FIG. 1C, free air ball 106a has been ultrasonically bonded to the first bond location 104a1 using a reference ultrasonic characteristic (e.g., 100 mA), and become bonded ball 106a'. In FIG. 1D, bond head assembly 110 moves away from bonded ball 106a'. Detection system 114 is used to ensure bonded ball 106a' is properly bonded to the first bond location 104a1 (e.g., to determine if a non-stick wire bond condition exists, to determine if a low shear strength wire bond condition exists, to determine if a low pull strength wire bond condition exists, and/or to determine if an unacceptable level of wire bond deformation exists, etc.). A desirable ball bond is formed in FIG. 1D, having used the reference ultrasonic characteristic.

As provided above, FIGS. 2A-2D and FIGS. 3A-3D represent repeating the bonding process at a plurality of adjusted levels (e.g., increments) of the reference ultrasonic characteristic (e.g., incremental decreases of 1%, incremental decreases of 5%, incremental increases of 1%, incremental increases of 5%, etc.). That is, the ultrasonic characteristic is iteratively adjusted (e.g., reduced by a predetermined value and/or percentage, increased by a predetermined value and/or percentage) until an unacceptable wire bonding condition is formed. In the example shown in FIGS. 2A-2D, at one adjusted level of the reference ultrasonic characteristic, an acceptable ball bond is formed in FIG. 2D.

This process is repeated until an unacceptable wire bonding condition occurs. FIGS. 3A-3D illustrate the occurrence of such an unacceptable wire bonding condition (e.g., a non-stick wire bond condition exists). On a reference wire bonding system 100, let us assume that this condition occurs at a reduction of 20% (i.e., 80 mA of electrical current is applied to achieve the unacceptable wire bonding condition). Thus, the reference unacceptable ultrasonic characteristic may be expressed as a value of the ultrasonic characteristic (e.g., 80 mA). However, the reference unacceptable ultrasonic characteristic may be expressed in other ways. For example, the reference unacceptable ultrasonic characteristic may be expressed as a percentage of the reference ultrasonic characteristic (i.e., 0.8*UCREF).

On a wire bonding system to be calibrated (e.g., wire bonding system 100'), let us assume that this condition occurs at a reduction of 25% (i.e., 75 mA of electrical current is applied to achieve the unacceptable wire bonding condition). Thus, the calibration unacceptable ultrasonic characteristic may be expressed as a value of the ultrasonic characteristic (e.g., 75 mA). However, the calibration unacceptable ultrasonic characteristic may be expressed in other ways. For example, the calibration unacceptable ultrasonic characteristic may be expressed as a percentage of the reference ultrasonic characteristic (i.e., 0.75*UCREF).

As will be appreciated, these processes may be repeated for a number of cycles to determine an accurate reference unacceptable ultrasonic characteristic and/or an accurate calibration unacceptable ultrasonic characteristic. That is, it may be that a certain percentage of unacceptable wire bond conditions occur in a calibration before declaring a reference unacceptable ultrasonic characteristic and/or a calibration unacceptable ultrasonic characteristic (e.g., a certain percentage of unacceptable wire bond conditions occur at a given adjusted ultrasonic characteristic).

For example, in the determination of a calibration unacceptable ultrasonic characteristic—an iterative process may be followed where a certain percentage of unacceptable wire bond conditions may have to occur before declaring the unacceptable result. For example, let us assume that 20 wire bonds are checked at each value of an applied ultrasonic characteristic. It may be that 3 unacceptable wire bond conditions (3 out of 20) are required before declaring the unacceptable result. Of course, this is just an example. Let us assume that the unacceptable result occurs at an electrical current level of 75 mA.

After determining the reference unacceptable ultrasonic characteristic and the calibration unacceptable ultrasonic characteristic, a calibration factor is determined. Such a calibration factor may be used to determine the ultrasonic characteristic setpoint for the wire bonding system to be calibrated. The calibration factor may be considered the difference between the reference unacceptable ultrasonic characteristic and the calibration unacceptable ultrasonic characteristic. The calibration factor may be provided in terms of a percentage. In the example above, the reference unacceptable ultrasonic characteristic may be considered to be $0.8*UC_{REF}$, and the calibration unacceptable ultrasonic characteristic may be considered to be $0.75*UC_{REF}$. In such an example, the calibration factor may be 5% ($0.05*UC_{REF}$).

In order to determine the ultrasonic characteristic setpoint for the wire bonding system to be calibrated—the calibration factor may be used. In the above example, the reference ultrasonic characteristic is 100 mA of electrical current. For the wire bonding system to be calibrated, with a calibration factor of 5%, the ultrasonic characteristic setpoint for the wire bonding system to be calibrated may be determined by reducing the reference ultrasonic characteristic by 5%. Thus, the ultrasonic characteristic setpoint may be considered to be 95 mA.

FIGS. 4-5 are flow diagrams illustrating methods of calibrating an ultrasonic characteristic on a wire bonding system. As is understood by those skilled in the art, certain steps included in the flow diagrams may be omitted; certain additional steps may be added; and the order of the steps may be altered from the order illustrated-all within the scope of the invention.

Referring to FIG. 4, at Step 400, a reference ultrasonic characteristic (e.g., an electrical current value configured to be applied to an ultrasonic transducer on the wire bonding system) for formation of a wire bond is determined. For example, Step 400 may include determining the reference ultrasonic characteristic on a reference wire bonding system (or a plurality of reference wire bonding systems) using application specific materials. Examples of application specific materials include at least one of: (i) a wire; (ii) a wire bonding tool; and (iii) a workpiece. For example, Step 400 may include determining the reference ultrasonic characteristic on a reference wire bonding system(s) using an application specific wire bonding program. For example, Step 400 may include determining the reference ultrasonic characteristic on a reference wire bonding system(s) using application specific wire bonding parameters.

Figure 3A:
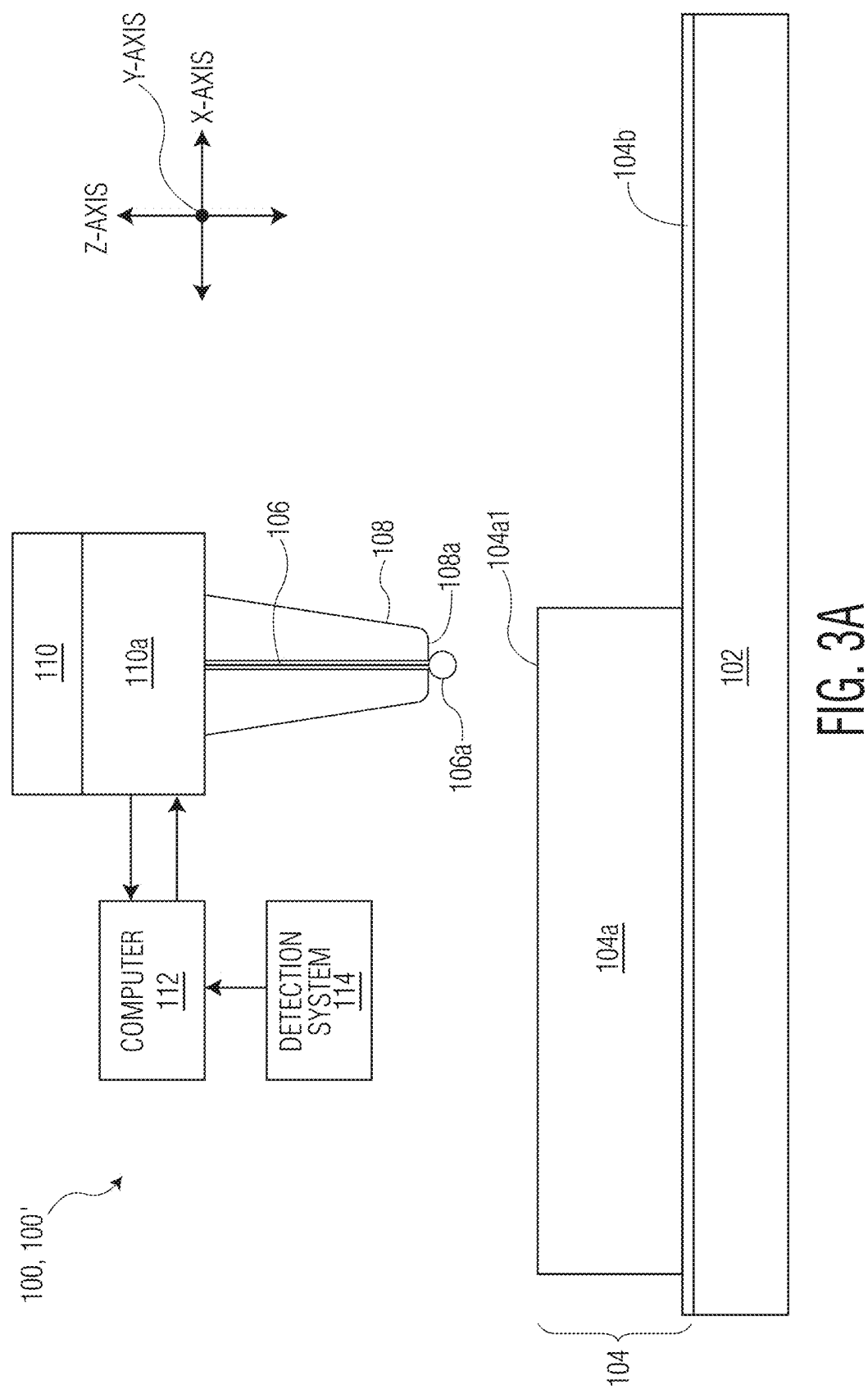
FIGS. 3A-3D are a series of block diagram views illustrating testing of a wire bond at another modified ultrasonic characteristic in accordance with an exemplary embodiment of the invention.
Figure 3B:
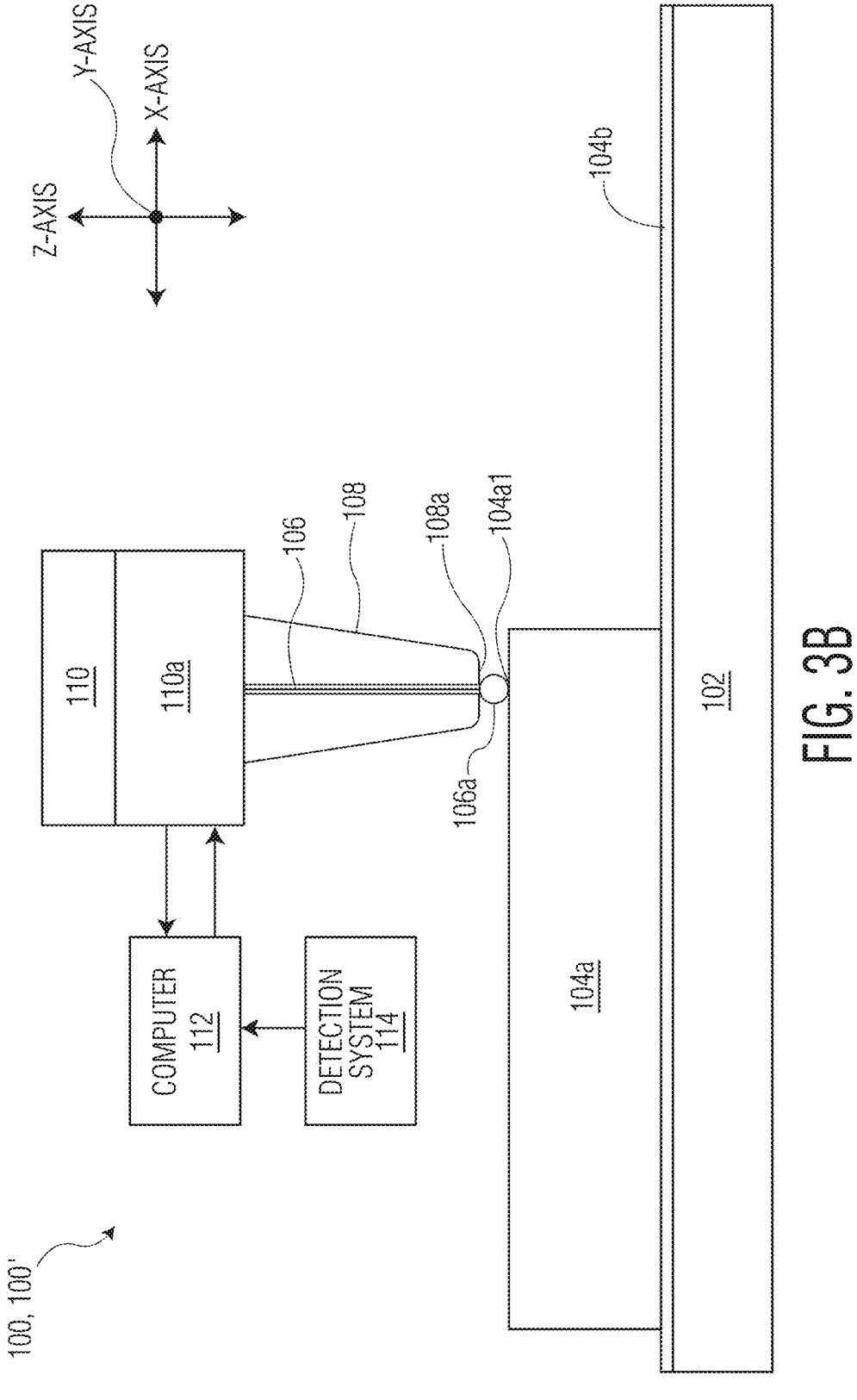
Figure 3C:
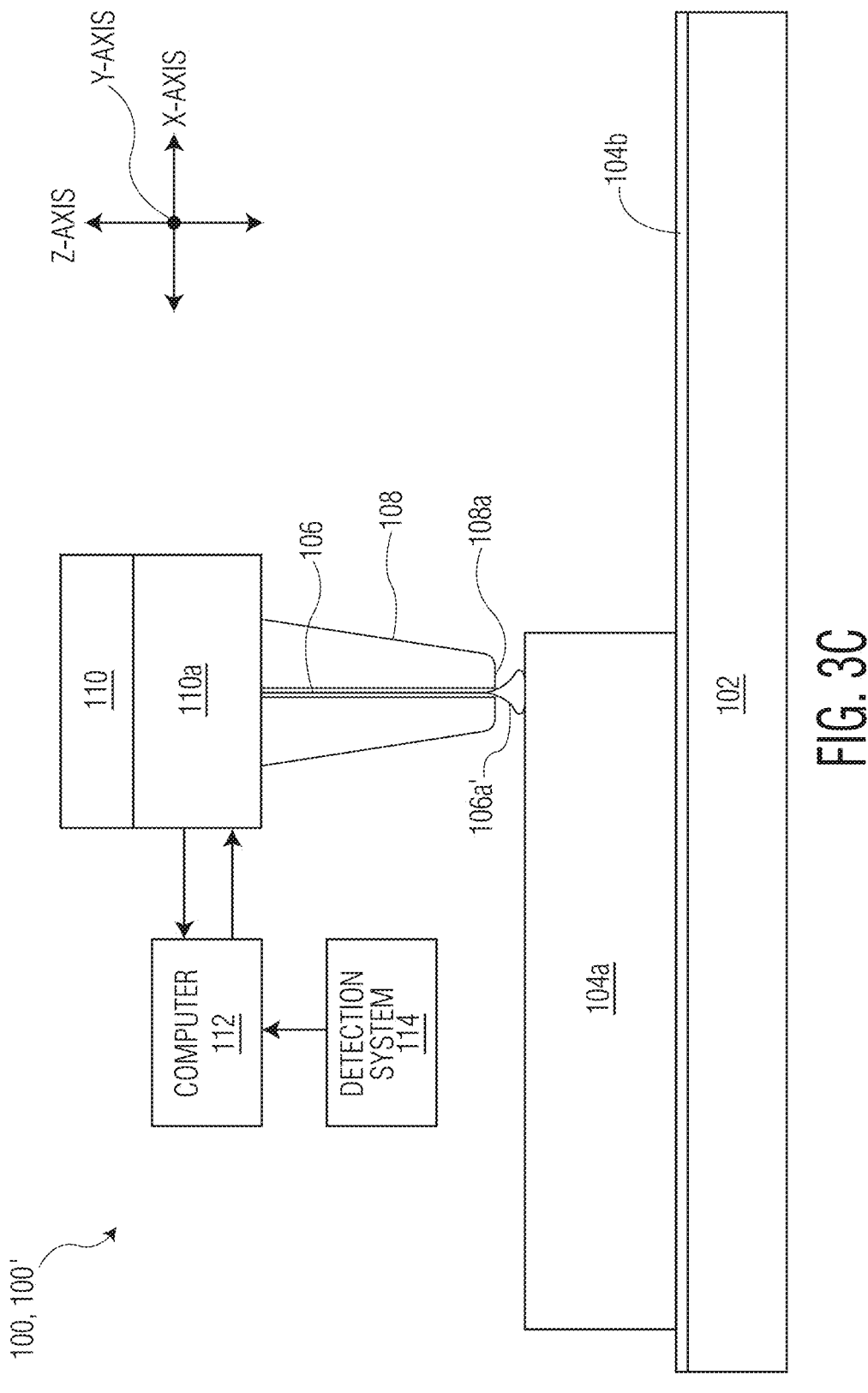
Figure 3D:
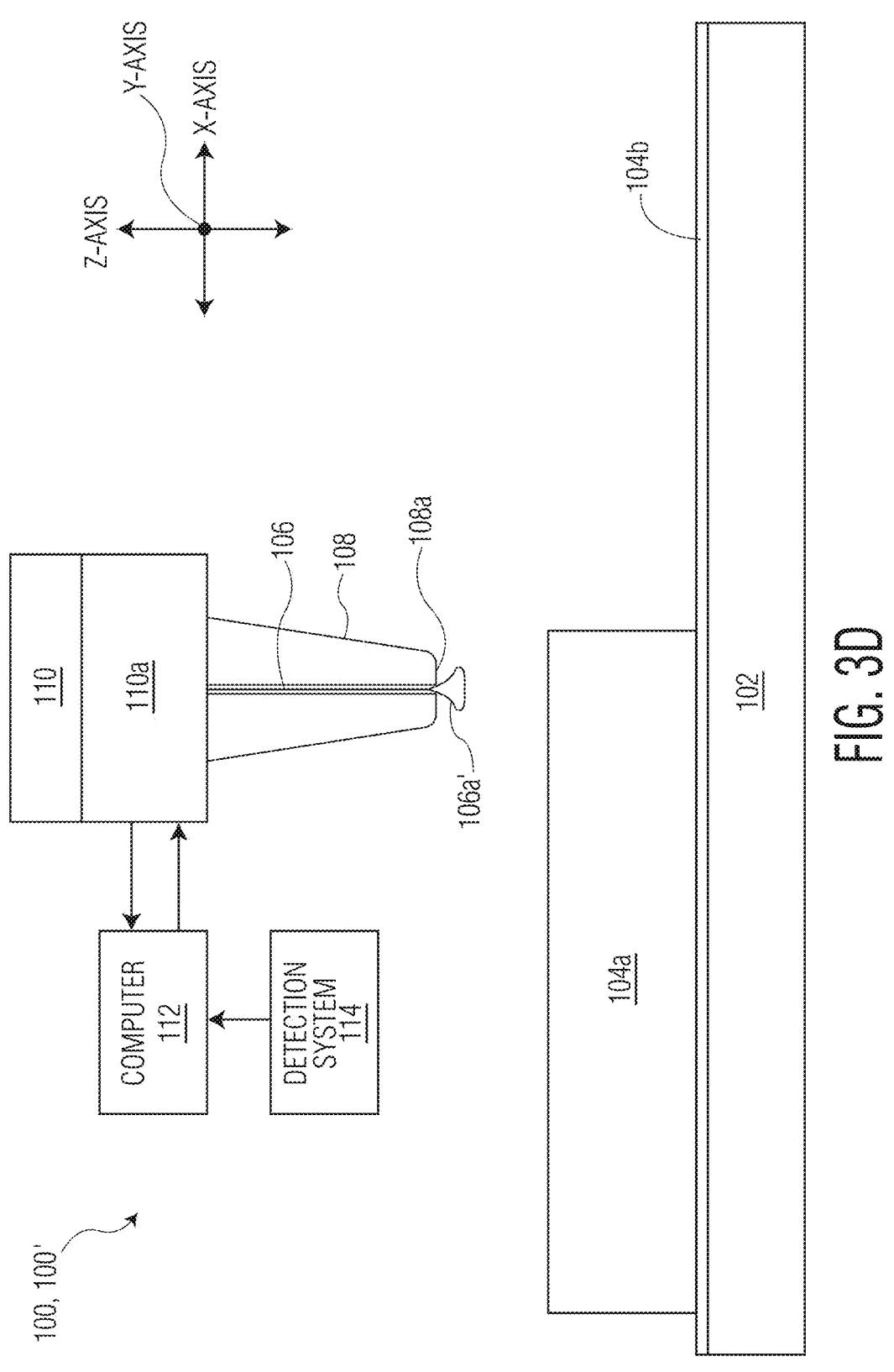

At Step 402, a reference non-stick ultrasonic characteristic that results in a non-stick wire bond condition is determined (e.g., on a reference wire bonding system). For example, Step 402 may include determining the reference non-stick ultrasonic characteristic by incrementally adjusting (e.g., reducing) an applied ultrasonic characteristic in wire bonding operations until the non-stick wire bond condition results. The reference non-stick ultrasonic characteristic may be considered the applied ultrasonic characteristic resulting in the non-stick wire bond condition. For example, the non-stick wire bond condition may occur with respect to Step 402 when a predetermined percentage of wire bonds tested at the applied ultrasonic characteristic do not stick to their respective bonding location. FIGS. 2A-2D and FIGS. 3A-3D illustrate incremental adjustments that result in an acceptable wire bond (FIG. 2D) and non-stick wire bond (FIG. 3D). The reference non-stick ultrasonic characteristic may be determined, for example, using the value (or percentage) of the reference ultrasonic characteristic corresponding to FIG. 3D (where the non-stick wire bond occurs).

At Step 404, a calibration non-stick ultrasonic characteristic is determined on a wire bonding system to be calibrated. The calibration non-stick ultrasonic characteristic results in a non-stick wire bond condition. For example, Step 404 may include determining the calibration non-stick ultrasonic characteristic by incrementally adjusting an applied ultrasonic characteristic in wire bonding operations until the non-stick wire bond condition results. The calibration non-stick ultrasonic characteristic may be considered the applied ultrasonic characteristic resulting in the non-stick wire bond condition. For example, the non-stick wire bond condition may occur with respect to Step 404 when a predetermined percentage of wire bonds tested at the applied ultrasonic characteristic do not stick to their respective bonding location. As stated above, FIGS. 2A-2D and FIGS. 3A-3D illustrate incremental adjustments that result in an acceptable wire bond (FIG. 2D) and a non-stick wire bond (FIG. 3D). The calibration non-stick ultrasonic characteristic may be determined, for example, using the value (or percentage) of the reference ultrasonic characteristic corresponding to FIG. 3D (where the non-stick wire bond occurs).

At Step 406, a calibration factor for the wire bonding system to be calibrated is determined using the reference non-stick ultrasonic characteristic and the calibration non-stick ultrasonic characteristic. For example, Step 406 may include determining a difference between the reference non-stick ultrasonic characteristic and the calibration non-stick ultrasonic characteristic.

Referring to FIG. 5, at Step 500, a reference ultrasonic characteristic (e.g., an electrical current value configured to be applied to an ultrasonic transducer on the wire bonding system) for formation of a wire bond is determined. For example, Step 500 may include determining the reference ultrasonic characteristic on a reference wire bonding system (or a plurality of reference wire bonding systems) using application specific materials. Examples of application specific materials include at least one of: (i) a wire, (ii) a wire bonding tool; and (iii) a workpiece. For example, Step 500 may include determining the reference ultrasonic characteristic on a reference wire bonding system(s) using an application specific wire bonding program. For example, Step 500 may include determining the reference ultrasonic characteristic on a reference wire bonding system(s) using application specific wire bonding parameters.

At Step 502, a reference unacceptable ultrasonic characteristic that results in an unacceptable wire bond condition is determined (e.g., on a reference wire bonding system). Examples of an unacceptable wire bond condition include one or more of: (i) a non-stick wire bond condition; (ii) a low shear strength wire bond condition; (iii) a low pull strength wire bond condition; and (iv) an unacceptable level of wire bond deformation. For example, Step 502 may include determining the reference unacceptable ultrasonic characteristic by incrementally adjusting (e.g., reducing) an applied ultrasonic characteristic in wire bonding operations until the unacceptable wire bond condition results. The reference non-stick ultrasonic characteristic may be considered the applied ultrasonic characteristic resulting in the unacceptable wire bond condition. For example, the unacceptable wire bond condition may occur with respect to Step 502 when a predetermined percentage of wire bonds tested at the applied ultrasonic characteristic are unacceptable according to predetermined criteria. FIGS. 2A-2D and FIGS. 3A-3D illustrate incremental adjustments that result in an acceptable wire bond (FIG. 2D) and an unacceptable wire bond (FIG. 3D). The reference unacceptable ultrasonic characteristic may be determined, for example, using the value (or percentage) of the reference ultrasonic characteristic corresponding to FIG. 3D (where the unacceptable wire bond occurs).

At Step 504, a calibration unacceptable ultrasonic characteristic is determined on a wire bonding system to be calibrated. The calibration unacceptable ultrasonic characteristic results in an unacceptable wire bond condition. For example, Step 504 may include determining the calibration unacceptable ultrasonic characteristic by incrementally adjusting (e.g., reducing, increasing, reducing and increasing, etc.) an applied ultrasonic characteristic in wire bonding operations until the unacceptable wire bond condition results. The calibration unacceptable ultrasonic characteristic may be considered the applied ultrasonic characteristic resulting in the unacceptable wire bond condition. For example, the unacceptable wire bond condition may occur with respect to Step 504 when a predetermined percentage of wire bonds tested at the applied ultrasonic characteristic are unacceptable according to predetermined criteria. As stated above, FIGS. 2A-2D and FIGS. 3A-3D illustrate incremental adjustments that result in an acceptable wire bond (FIG. 2D) and an unacceptable wire bond (FIG. 3D). The calibration unacceptable ultrasonic characteristic may be determined, for example, using the value (or percentage) of the reference ultrasonic characteristic corresponding to FIG. 3D (where the unacceptable wire bond occurs).

At Step 506, a calibration factor for the wire bonding system to be calibrated is determined using the reference unacceptable ultrasonic characteristic and the calibration unacceptable ultrasonic characteristic. For example, Step 506 may include determining a difference between the reference unacceptable ultrasonic characteristic and the calibration unacceptable ultrasonic characteristic.

The method of FIGS. 4 and 5 may be further extended to include additional steps, such as: determining an ultrasonic characteristic setpoint for the wire bonding system to be calibrated using the calibration factor; and forming wire bonds (e.g., first bonds of a wire loop, a bump, a ball bond of a vertical wire, etc.) using the ultrasonic characteristic setpoint.

The calibrations described herein: address machine to machine portability issues and material variations (e.g., variations in wire, wire bonding tools, workholders, workpieces, etc.)—without using off bonder metrology. These new calibrations may be used to take into account the specific wire bonding tool (e.g., capillary), wire, workholder, and workpiece (e.g., die, substrate, etc.) used in a wire bonding application.

Although the invention has been illustrated and described primarily with respect to first bonds of a wire loop (e.g., ball bonds), it is not limited thereto. The teachings of the invention may be applied to any bonded portion of wire, including a second bond of a wire loop, a stitch bond, a bonded ball, a bump, a ball bond of a vertical wire, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of calibrating an ultrasonic characteristic on a wire bonding system to be calibrated, the method comprising the steps of:
   (a) determining a reference ultrasonic characteristic using reference response data from one or more reference wire bonding systems for formation of a wire bond;
   (b) determining a reference non-stick ultrasonic characteristic using one or more reference wire bonding systems that results in a non-stick wire bond condition;
   (c) determining a calibration non-stick ultrasonic characteristic, on the wire bonding system to be calibrated, that results in a non-stick wire bond condition; and
   (d) determining an ultrasonic characteristic setpoint for the wire bonding system to be calibrated using the reference non-stick ultrasonic characteristic and the calibration non-stick ultrasonic characteristic.

2. The method of claim 1 wherein step (a) includes determining the reference ultrasonic characteristic on the one or more reference wire bonding systems using application specific materials.

3. The method of claim 2 wherein the application specific materials include at least one of a wire, a wire bonding tool, and a workpiece.

4. The method of claim 1 wherein step (a) includes determining the reference ultrasonic characteristic on the one or more reference wire bonding systems using an application specific wire bonding program.

5. The method of claim 1 wherein step (a) includes determining the reference ultrasonic characteristic on the one or more reference wire bonding systems using application specific wire bonding parameters.

6. The method of claim 1 wherein the reference ultrasonic characteristic is an electrical current value configured to be applied to an ultrasonic transducer on a wire bonding system to form the wire bond.

7. The method of claim 1 wherein step (b) includes determining the reference non-stick ultrasonic characteristic by incrementally adjusting an applied ultrasonic characteristic in wire bonding operations until the non-stick wire bond condition results.

8. The method of claim 1 wherein step (c) includes determining the calibration non-stick ultrasonic characteristic by incrementally adjusting an applied ultrasonic characteristic in wire bonding operations until the non-stick wire bond condition results.

9. The method of claim 1 wherein step (d) includes determining a calibration factor for the wire bonding system to be calibrated using the reference non-stick ultrasonic characteristic and the calibration non-stick ultrasonic characteristic.

10. The method of claim 9 wherein step (d) includes determining the ultrasonic characteristic setpoint for the wire bonding system to be calibrated using the calibration factor.

11. A method of calibrating an ultrasonic characteristic on a wire bonding system to be calibrated, the method comprising the steps of:
   (a) determining a reference ultrasonic characteristic using reference response data from one or more reference wire bonding systems for formation of a wire bond;
   (b) determining a reference unacceptable ultrasonic characteristic using one or more reference wire bonding systems that results in an unacceptable wire bond condition;
   (c) determining a calibration unacceptable ultrasonic characteristic, on the wire bonding system to be calibrated, that results in an unacceptable wire bond condition; and
   (d) determining an ultrasonic characteristic setpoint for the wire bonding system to be calibrated using the reference unacceptable ultrasonic characteristic and the calibration unacceptable ultrasonic characteristic.

12. The method of claim 11 wherein step (a) includes determining the reference ultrasonic characteristic on the one or more reference wire bonding systems using application specific materials.

13. The method of claim 12 wherein the application specific materials include at least one of a wire type, a wire bonding tool type, and a workpiece.

14. The method of claim 11 wherein step (a) includes determining the reference ultrasonic characteristic on the one or more reference wire bonding systems using an application specific wire bonding program.

15. The method of claim 11 wherein step (a) includes determining the reference ultrasonic characteristic on the one or more reference wire bonding system using application specific wire bonding parameters.

16. The method of claim 11 wherein the reference ultrasonic characteristic is an electrical current value configured to be applied to an ultrasonic transducer on a wire bonding system to form the wire bond.

17. The method of claim 11 wherein step (b) includes determining the reference unacceptable ultrasonic characteristic by incrementally adjusting an applied ultrasonic characteristic in wire bonding operations until the unacceptable wire bond condition results.

18. The method of claim 11 wherein step (c) includes determining the calibration unacceptable ultrasonic characteristic by incrementally reducing an applied ultrasonic characteristic in wire bonding operations until the unacceptable wire bond condition results.

19. The method of claim 11 wherein step (d) includes determining a calibration factor for the wire bonding system to be calibrated using the reference unacceptable ultrasonic characteristic and the calibration unacceptable ultrasonic characteristic.

20. The method of claim 11 wherein the unacceptable wire bond condition is a non-stick wire bond condition.

21. The method of claim 11 wherein the unacceptable wire bond condition is a low shear strength wire bond condition.

22. The method of claim 11 wherein the unacceptable wire bond condition is a low pull strength wire bond condition.

23. The method of claim 11 wherein the unacceptable wire bond condition is an unacceptable level of wire bond deformation.

24. The method of claim 19 wherein step (d) includes determining the ultrasonic characteristic setpoint for the wire bonding system to be calibrated using the calibration factor.

\* \* \* \* \*